United States Patent
Joardar et al.

(10) Patent No.: US 12,453,043 B2
(45) Date of Patent: Oct. 21, 2025

(54) MECHANICALLY EXPANDED MICROFIN TUBE LIQUID COOLED HEAT SINK

(71) Applicant: Carrier Corporation, Palm Beach Gardens, FL (US)

(72) Inventors: Arindom Joardar, Jamesville, NY (US); Lokanath Mohanta, Liverpool, NY (US); Konstantin Borisov, Avon, CT (US); Ismail Agirman, Southington, CT (US)

(73) Assignee: CARRIER CORPORATION, Palm Beach Gardens, FL (US)

( * ) Notice: Subject to any disclaimer, the term of this patent is extended or adjusted under 35 U.S.C. 154(b) by 324 days.

(21) Appl. No.: 18/051,977

(22) Filed: Nov. 2, 2022

(65) Prior Publication Data
US 2023/0292464 A1    Sep. 14, 2023

Related U.S. Application Data

(60) Provisional application No. 63/274,587, filed on Nov. 2, 2021.

(51) Int. Cl.
*H05K 7/20* (2006.01)

(52) U.S. Cl.
CPC ....... *H05K 7/20263* (2013.01); *H05K 7/2089* (2013.01); *H05K 7/209* (2013.01); *H05K 7/20927* (2013.01)

(58) Field of Classification Search
CPC .. H05K 7/20263; H05K 7/2089; H05K 7/209; H05K 7/20927
USPC .......................................................... 361/699
See application file for complete search history.

(56) References Cited

U.S. PATENT DOCUMENTS

| | | | | |
|---|---|---|---|---|
| 5,829,516 | A * | 11/1998 | Lavochkin | H01L 25/117 29/890.038 |
| 6,651,732 | B2 * | 11/2003 | Sagal | H01L 21/4882 165/185 |
| 2003/0121650 | A1 * | 7/2003 | Strahle | F28D 15/02 165/170 |
| 2003/0223173 | A1 * | 12/2003 | Fichera | H05K 7/20927 257/E23.098 |
| 2007/0234871 | A1 * | 10/2007 | Thors | F28F 1/422 83/875 |

(Continued)

FOREIGN PATENT DOCUMENTS

WO    2012048432 A1    4/2012

OTHER PUBLICATIONS

European Seach Report for European Application No. 22205100.5; dated Mar. 23, 2023; 118 pages.

*Primary Examiner* — Zhengfu J Feng
(74) *Attorney, Agent, or Firm* — CANTOR COLBURN LLP (57) ABSTRACT

A method of forming a power electronics assembly includes forming a plurality of pathway openings in a heat exchanger body and inserting a tubular member in each pathway opening of the plurality of pathway openings. The tubular member includes a plurality of internal surface enhancements. An interference fit is defined between the tubular members and the heat exchanger body via one or more of mechanical or thermal expansion to define a plurality of fluid pathways in the heat exchanger. One or more power electronics devices are installed to the heat exchanger body.

19 Claims, 10 Drawing Sheets

(56) References Cited

U.S. PATENT DOCUMENTS

| | | | |
|---|---|---|---|
| 2009/0052134 A1* | 2/2009 | Casteel | H05K 7/20927 |
| | | | 361/699 |
| 2020/0158446 A1* | 5/2020 | Alahyari | F28F 13/187 |
| 2023/0025136 A1* | 1/2023 | Yamada | F25B 49/022 |

* cited by examiner

MECHANICALLY EXPANDED MICROFIN TUBE LIQUID COOLED HEAT SINK

CROSS-REFERENCE TO RELATED APPLICATIONS

This application claims the benefit of U.S. Provisional Patent Application No. 63/274,587 filed Nov. 2, 2021, the disclosure of which is incorporated herein by reference in its entirety.

BACKGROUND

Exemplary embodiments pertain to the art of heat exchangers, and more particularly to heat exchangers for cooling power electronics.

Power electronics devices such as motor drives generate waste heat during operation of the device. Additionally, when the power electronics devices heat up the operational efficiency of the devices can degrade adding to the amount of heat generated. When utilized in a refrigeration system to drive, for example, a compressor of the refrigeration system, effective thermal integration of these devices can be important aspect to the system's overall efficiency and reliability. Consequently, a goal of the system integrator is to maintain these components within a range of operating temperatures which will maximize the system efficiency. One means of integrated cooling is to provide refrigerant from the refrigeration system to cool the power electronics. However, current liquid cooled heat exchanger for power electronics have high manufacturing costs and low effectiveness. Accordingly, there remains a need in the art for lower cost and more effective heat exchangers for power electronic devices which can maintain optimal temperatures for these components under a variety of load conditions.

BRIEF DESCRIPTION

In one embodiment, a method of forming a power electronics assembly includes forming a plurality of pathway openings in a heat exchanger body and inserting a tubular member in each pathway opening of the plurality of pathway openings. The tubular member includes a plurality of internal surface enhancements. An interference fit is defined between the tubular members and the heat exchanger body via one or more of mechanical or thermal expansion to define a plurality of fluid pathways in the heat exchanger. One or more power electronics devices are installed to the heat exchanger body.

Additionally or alternatively, in this or other embodiments the tubular members are formed from a flat sheet, which is rolled and mechanically secured into a tubular shape.

Additionally or alternatively, in this or other embodiments the plurality of internal surface enhancements are formed on the flat sheet.

Additionally or alternatively, in this or other embodiments the plurality of internal surface enhancements include a plurality of fins.

Additionally or alternatively, in this or other embodiments the plurality of fins extend helically along a length of the fluid pathways.

Additionally or alternatively, in this or other embodiments the mechanical expansion is performed via insertion of an expansion bullet into the tubular members.

Additionally or alternatively, in this or other embodiments the plurality of pathway openings are formed by one of drilling, extrusion or casting.

Additionally or alternatively, in this or other embodiments the plurality of fluid pathways are connected to an inlet manifold and an outlet manifold.

Additionally or alternatively, in this or other embodiments the plurality of fluid pathways are connected to the inlet manifold and the outlet manifold by brazing.

Additionally or alternatively, in this or other embodiments the tubular members are formed from one of a copper or aluminum material.

Additionally or alternatively, in this or other embodiments one or more of the tubular members have a U-shaped bend.

Additionally or alternatively, in this or other embodiments the plurality of fluid pathways each have an internal diameter in the range of 3 millimeters to 15 millimeters.

In another embodiment, a power electronics assembly includes one or more power electronics devices, and a heat exchanger to which the one or more power electronics devices are mounted. The heat exchanger includes a heat exchanger body, one or more pathway openings formed in the heat exchanger body, and a tubular member installed in each pathway opening of the one or more pathway openings. The tubular member includes one or more internal surface enhancements. The tubular members are secured into an interference fit with the heat exchanger body via one of mechanical expansion or thermal expansion to define a plurality of fluid pathways in the heat exchanger. The one or more fluid pathways transfer thermal energy from the one or more power electronics devices into a flow of fluid in the one or more fluid pathways. The flow of fluid is a flow of liquid refrigerant diverted from a condenser of a heating, ventilation, and air conditioning (HVAC) system.

Additionally or alternatively, in this or other embodiments the plurality of internal surface enhancements include a plurality of fins.

Additionally or alternatively, in this or other embodiments the plurality of fins extend helically along a length of the fluid pathways.

Additionally or alternatively, in this or other embodiments the one or more tubular members includes a U-shaped bend.

Additionally or alternatively, in this or other embodiments an inlet manifold is operably connected to the one or more fluid pathways at a first end of the one or more fluid pathways, and an outlet manifold is operably connected to the one or more fluid pathways at a second end of the one or more fluid pathways, opposite the first end.

Additionally or alternatively, in this or other embodiments the tubular members are formed from one of a copper or aluminum material.

Additionally or alternatively, in this or other embodiments the plurality of fluid pathways each have an internal diameter in the range of 3 millimeters to 15 millimeters.

Additionally or alternatively, in this or other embodiments each fin of the plurality of fins has a fin height in the range of 0.2 millimeters to 0.5 millimeters.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
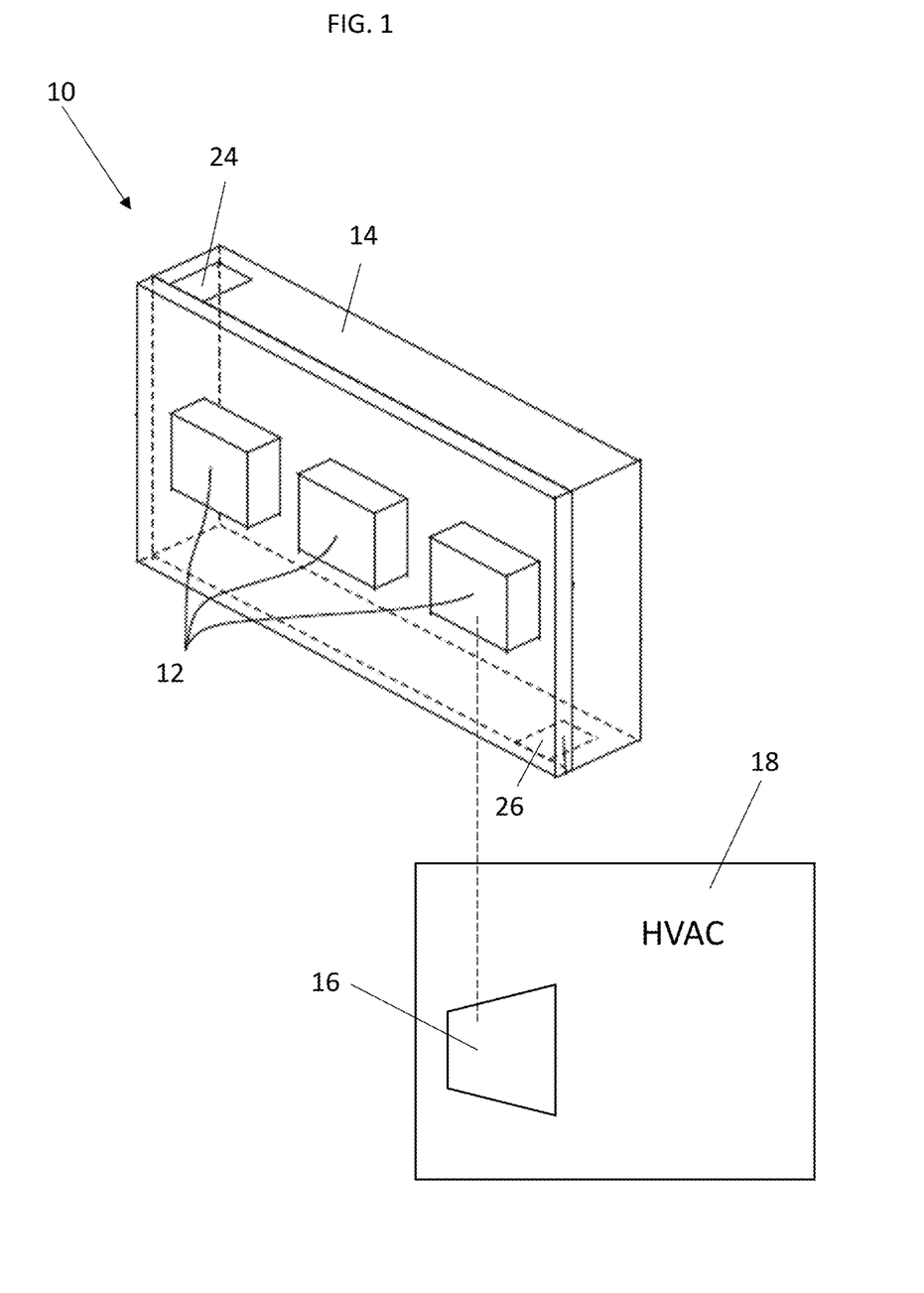
FIG. 1 is an illustration of an embodiment of a power electronics assembly.

Illustrated in FIG. 1 is an embodiment of a power electronics assembly 10. The power electronics assembly 10 includes one or more power electronics devices 12 mounted to a heat exchanger 14 utilized to reject and dissipate thermal energy generated by the power electronics devices 12 during operation. In some embodiments, the power electronics devices 12 include a variable frequency drive (VFD) operably connected to a compressor 16 of a heating, ventilation, and air conditioning (HVAC) system 18.

Figure 2:
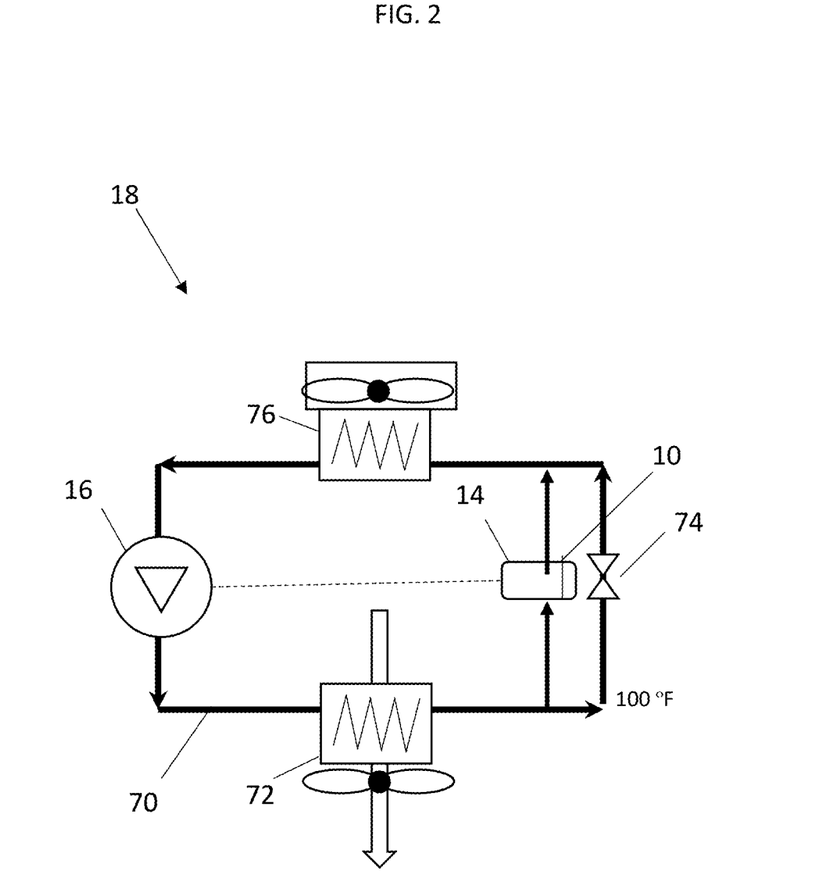
FIG. 2 is an illustration of an embodiment of a heating, ventilation, and air conditioning (HVAC) system.

Referring to FIG. 2, the HVAC system 18 includes, for example, a vapor compression circuit 70 including the compressor 16, a condenser 72, an expansion device 74 and an evaporator 76 arranged in series and having a volume of refrigerant flowing therethrough. The power electronics assembly 10 is connected to the vapor compression circuit 70 such that a portion of the flow of liquid refrigerant exiting the condenser 72 is diverted through the heat exchanger 14, bypassing the expansion device 74 and is directed from the heat exchanger 14 to the evaporator 76. The liquid refrigerant from the condenser 72 absorbs thermal energy at the heat exchanger 14. It should be appreciated that this refrigerant may be boiled, changing phase of the refrigerant from liquid to vapor inside the heat exchanger 14.

Figure 3:
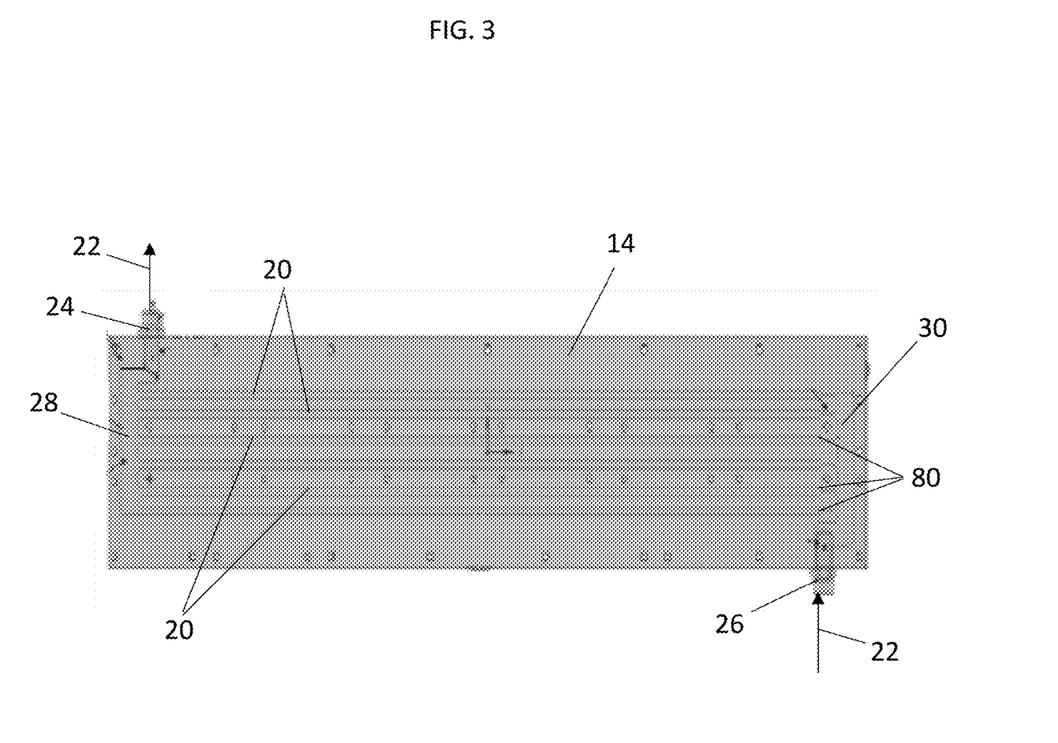
FIG. 3 is an illustration of an embodiment of a heat exchanger of a power electronics assembly.

Referring now to FIG. 3, the heat exchanger 14 is illustrated in more detail. The heat exchanger 14 includes a plurality of enclosed fluid pathways 20 extending therethrough, and having a flow of fluid 22 such as, for example, refrigerant, glycol, or water flowing therein. The fluid pathways 20 extend between a heat exchanger inlet 26 through which the flow of fluid 22 enters the heat exchanger 14, and a heat exchanger outlet 24 through which the flow of fluid 22 exits the heat exchanger 14. The heat exchanger inlet 26 is connected to the fluid pathways 20 via an inlet manifold 30 to distribute the flow of fluid 22 to the fluid pathways 20, and similarly the heat exchanger outlet 24 is connected to the fluid pathways 20 via an outlet manifold 28. Immediately downstream of the inlet manifold 30, orifices 80 of different diameters, increasing with increasing distance from the heat exchanger inlet 26 are provided to distribute the flow of fluid 22 from the inlet manifold 30 equally among all of the fluid pathways 20. The enhancement features described in the following text will be in the fluid pathways 20 downstream of the respective orifices 80.

In some embodiments, the heat exchanger 14 is formed from a metal material, such as aluminum, aluminum alloy, steel, steel alloy, copper, copper alloy, or the like, and referring again to FIG. 1, may be formed from two or more plates 32, 34 abutting one another along a side and joined using any suitable means such as brazing, welding, clamping, compressing, bolting, and the like. The plates 32, 34 may each include a portion of the fluid pathways 20, the inlet manifold 30, the outlet manifold 28, the heat exchanger inlet 26 and/or the heat exchanger outlet 24 formed therein. The mating surfaces of the plates 32, 34 can be configured to correspond to one another, e.g., to fit together and seal the fluid circuit therebetween. The mating surfaces of the plates 32, 34 can include precision surfaces formed from a process having highly accurate and precise dimensional control, such as through computer numerical control (CNC) machining process and/or net shape, or near net shape manufacturing process. Optionally or additionally, a sealing material can be disposed between the plates 32, 34 to aide in preventing leakage from the fluid circuit.

In operation, the flow of fluid 22, liquid refrigerant from the condenser 72, enters the heat exchanger 14 at the heat exchanger inlet 26 and is distributed to the fluid pathways 20 via the inlet manifold 30. The heat exchanger 14 conducts thermal energy (i.e., heat) from the power electronics devices 12 and thermal energy is exchanged with the flow of fluid 22 flowing through the fluid pathways 20, resulting in cooling of the power electronics devices 12 by boiling of the liquid refrigerant. The vapor flow of fluid 22 is then collects at the outlet manifold 28 and exits the heat exchanger 14 at the heat exchanger outlet 24.

Figure 4:
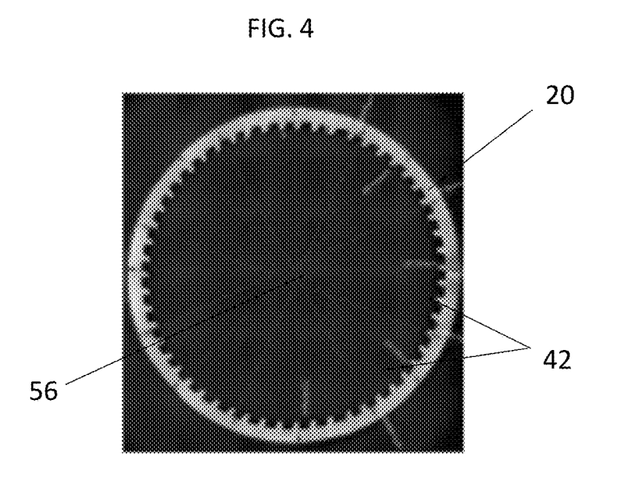
FIG. 4 is a cross-sectional view of an embodiment of a fluid pathway having internal fins.
Figure 5:
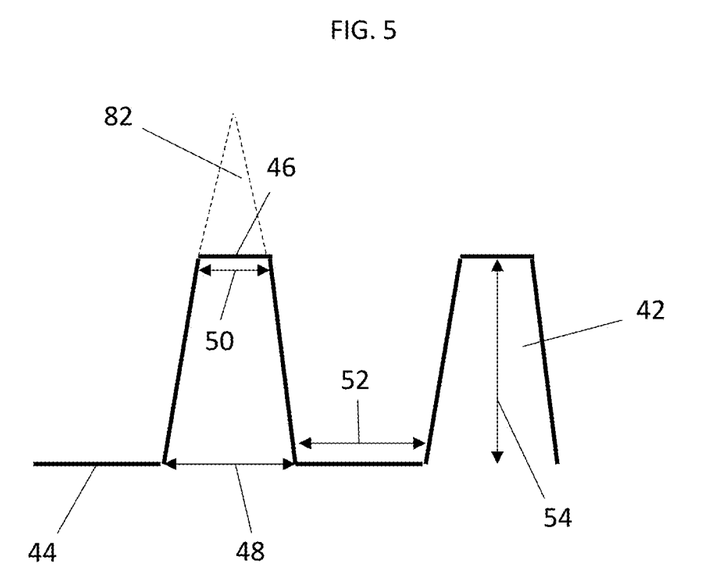
FIG. 5 is a perspective view of an embodiment of a fin structure.
Figure 6:
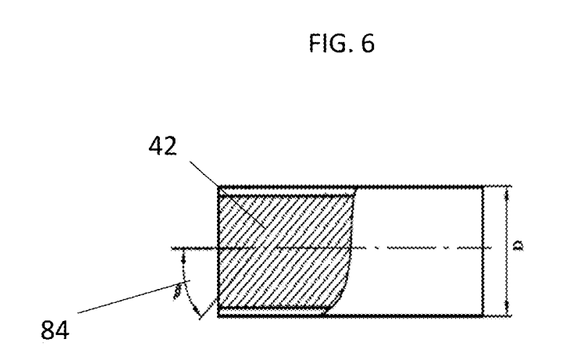
FIG. 6 is an illustration of a helix angle of a fin structure.

Referring now to FIGS. 4 and 5, in some embodiments, the fluid pathways 20 include a plurality of fins 42 extending radially inwardly from a pathway inner wall 44 to a fin tip 46. Each fin 42 has a circumferential base width 48 and a circumferential tip width 50, as well as a circumferential fin spacing 52 between adjacent fins 42, defined at the pathway inner wall 44. In some embodiments, the tip width 50 is in the range of 0.01 millimeters to 0.1 millimeters. Additionally, the fin spacing 52 may be in the range of 0.05 millimeters and 0.5 millimeters. The fins 42 further each have a fin height 54 from the pathway inner wall 44 to the fin tip 46. The fin height 54 may be in a range of, for example, 0.2 millimeters to 0.5 millimeters, depending on a pathway hydraulic diameter, which in some embodiments is in the range of 5 millimeters to 20 millimeters. In some embodiments, a number of fins 42 in a fluid pathway 20 is in the range of 30-80 fins 42. The plurality of fins 42 may extend substantially linearly parallel to a pathway central axis 56 or alternatively may extend helically about the pathway central axis 56 along a length of the pathway 20, at a helix angle 82 in the range of 10 degrees to 30 degrees, such as shown in FIG. 6. Additionally, referring again to FIG. 5, the fins 42 have an apex angle 84 between adjacent sidewalls of the fins 42, which may be in the range of 20 degrees to 60 degrees.

Figure 7:
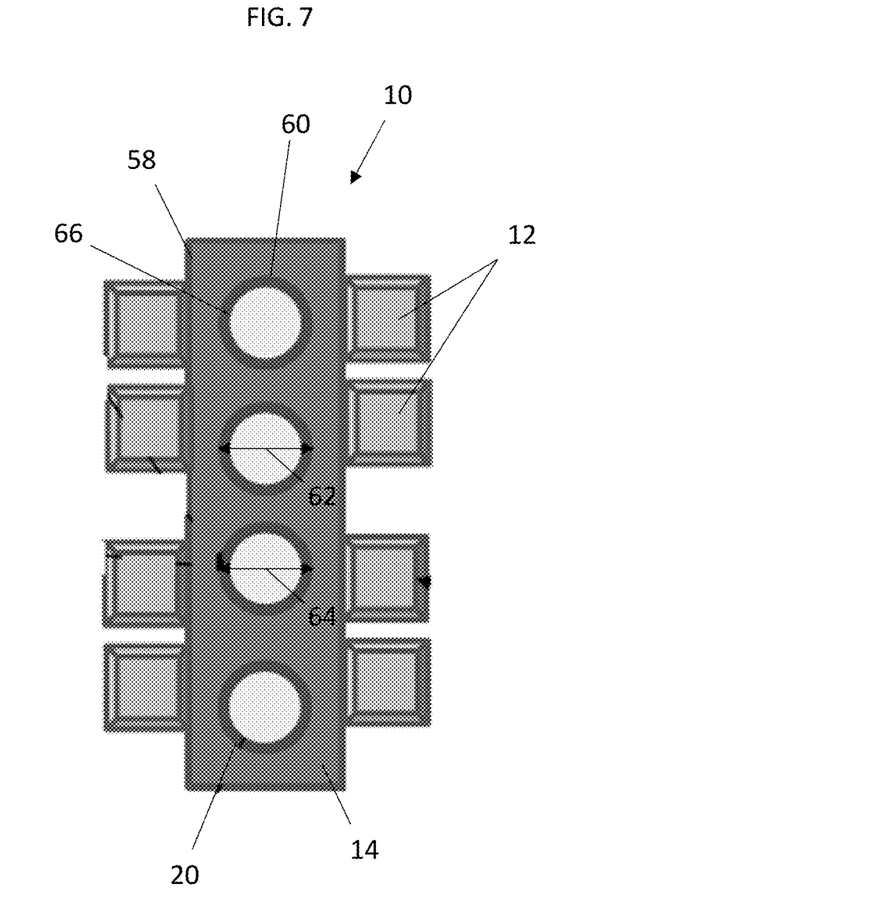
FIG. 7 is cross-sectional view of an embodiment of a heat exchanger.

Referring now to FIG. 7, the heat exchanger 14 includes a heat exchanger body 58 having pathway openings 60 into which the fluid pathways 20 are installed as tubular elements 66 having an outer tube diameter 62 less than an opening diameter 64 of the pathway opening 60 into which the tubular elements 66 are installed. In some embodiments, the tubular elements 66 are formed from a copper or aluminum material (e.g., such as aluminum, aluminum alloy, steel, steel alloy, copper, copper alloy, or the like).

Figure 8:
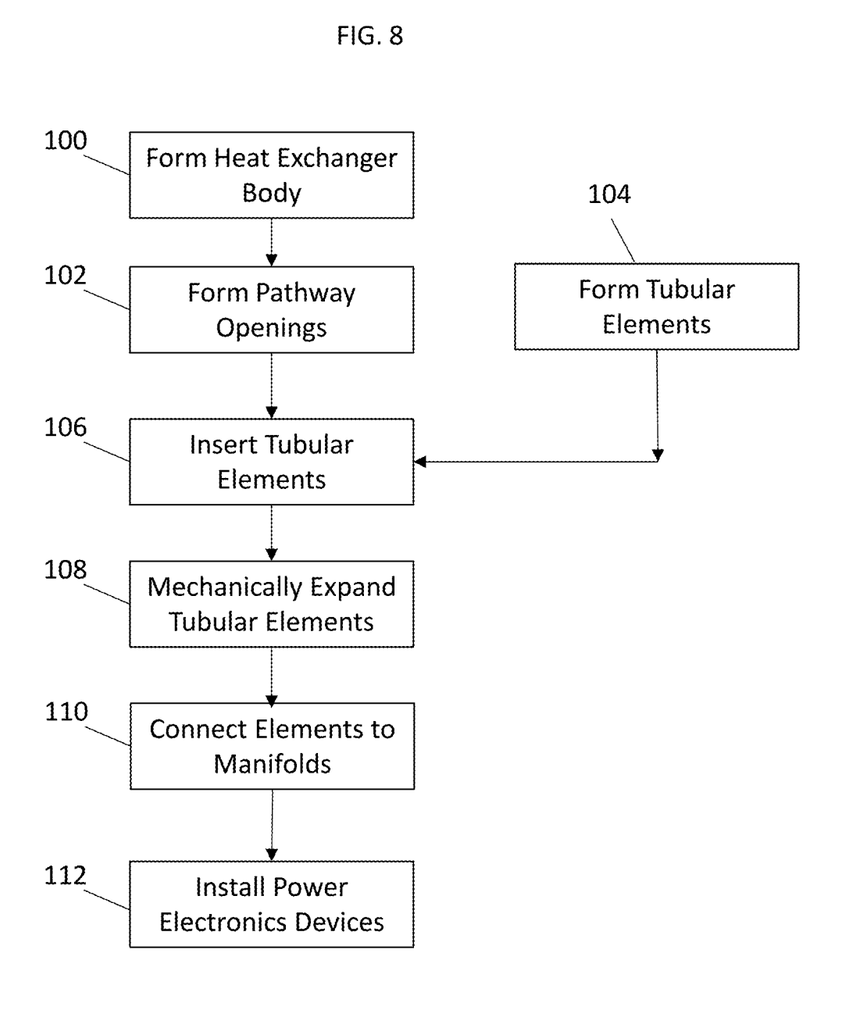
FIG. 8 is a schematic illustration of an exemplary method of forming an embodiment of a power electronics assembly.

Referring now to FIG. 8, a method of constructing the heat exchanger 14 (such as the heat exchanger 14 described above) is illustrated. At step 100, the heat exchanger body 58 is formed with the pathway openings 60 formed at step 102 by, for example, drilling, extrusion, or casting. The tubular elements 66, including a plurality of internal surface enhancements, such as the plurality of fins 42, are formed at step 104.

Figure 9:
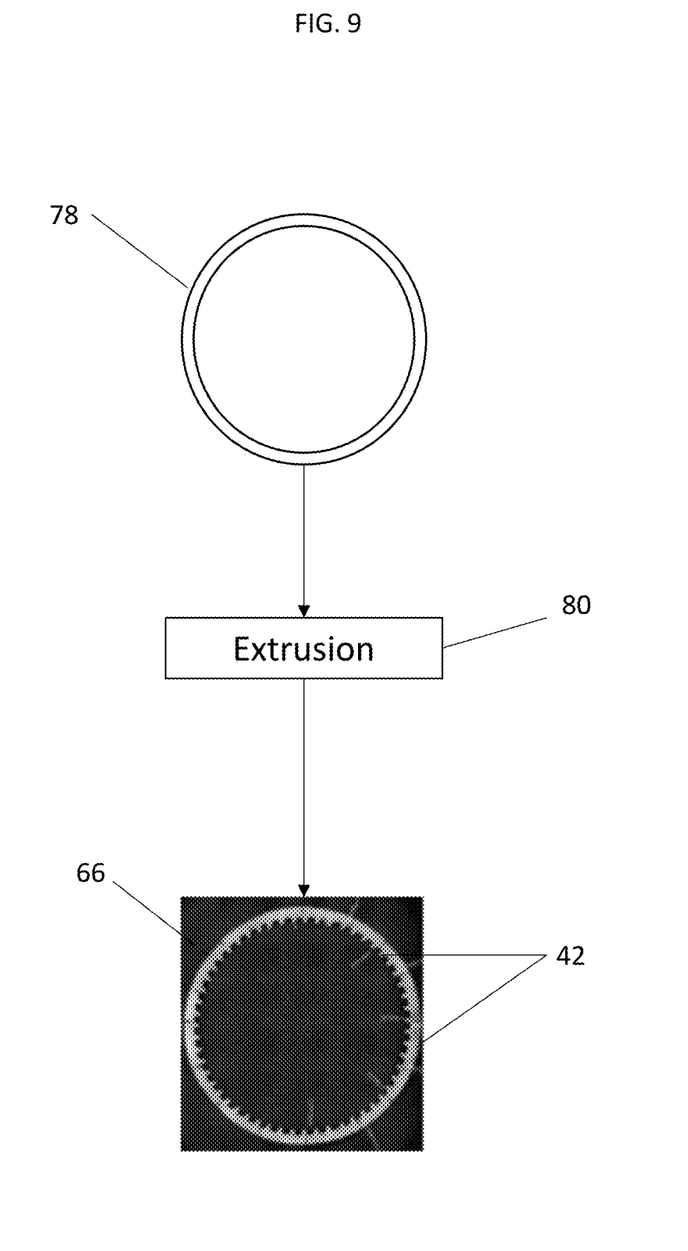
FIG. 9 is a schematic illustration of an exemplary method of forming a tubular element of a heat exchanger.
Figure 10:
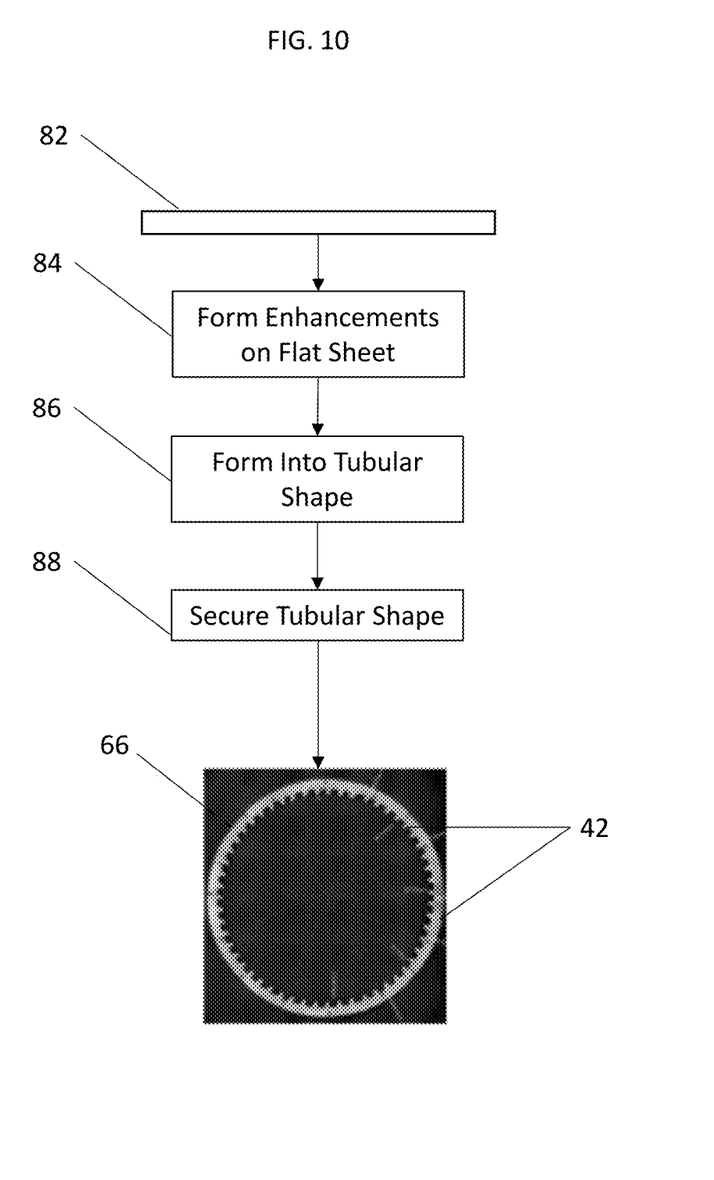
FIG. 10 is a schematic illustration of another exemplary method of forming a tubular element of a heat exchanger.

Referring now to FIG. 9, in some embodiments the tubular elements 66 are formed from a smooth-walled tube 78 with the plurality of fins 42 formed in the tube 78 via an extrusion process, illustrated schematically at 80. In another embodiment, illustrated at FIG. 10, the tubular elements 66 are formed from a flat sheet 82 on which the desired fins 42 and/or other surface enhancements are formed on the flat sheet 82 by, for example, an embossment process at 84. The flat sheet 82 is then rolled into a tubular shape at 86 and secured by, for example, welding at 88. This process may allow for the formation of more complex enhancement shapes and patterns into the tubular element 66 than the extrusion process.

Referring again to FIG. 8, the tubular elements 66 are inserted into the pathway openings 60 at step 106. At step 108, the tubular elements 66 are mechanical expanded into an interference fit with the pathway heat exchanger body 58. The mechanical expansion may be performed by insertion of an expansion bullet into the tubular element 66, thus defining the fluid pathways 20 having an inside diameter in the range of, for example, 3 millimeters to 15 millimeters. In some embodiments, the plurality of fins 42 are also formed in the fluid pathways 20 via the expansion bullet, simultaneously with the mechanical expansion. While mechanical expansion of the tubular elements 66 is illustrated and described herein, one skilled in the art will readily appreciate that the tubular elements 66 may be installed and secured into the pathway openings 62 by thermal expansion. In such a process, the heat exchanger body 58 is heated sufficiently to enlarge the pathway openings 62 to allow for installation of the tubular elements 66. Once the tubular elements 66 are inserted into the pathway openings 62, the assembly is quenched to cool the assembly, thus resulting in an interference fit between the tubular elements 66 and the heat exchanger body 58. The mechanically expanded fluid pathways 20 are then connected to the inlet manifold 28 and the outlet manifold 30 by, for example, brazing at step 110. At step 112, the power electronics devices 12 are installed to the heat exchanger 14 (e.g., the external surface of the heat exchanger body 58) to complete the power electronics assembly 10.

Figure 11:
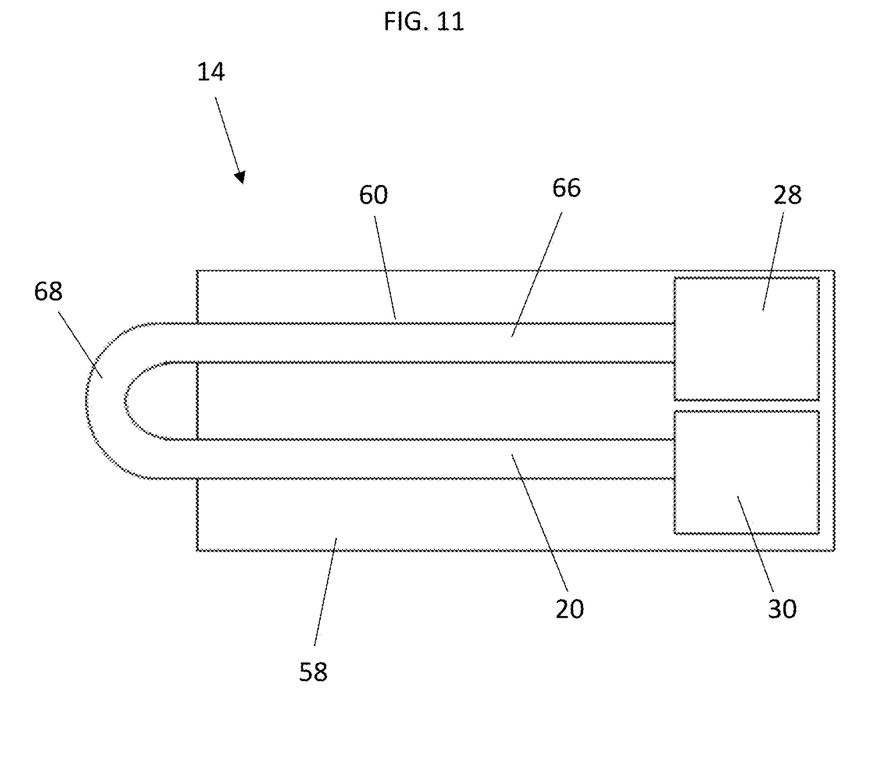
FIG. 11 is another cross-sectional view of an embodiment of a heat exchanger.

Referring to FIG. 11, in some embodiments, the tubular elements 66 include a U-shaped, hairpin, bend 68 which allows the connections to the inlet manifold 28 and outlet manifold 30 at the same end of the heat exchanger 14.

The configurations of heat exchangers 14 and power electronics assemblies 10 disclosed herein increase heat transfer area in the fluid pathways 20 and promote convective evaporation to improve heat transfer rate of the heat exchanger 14. Further, the configurations reduce a volume of heat exchanger 14 for cooling the power electronics devices 12. Further, the use of the mechanical expansion process reduces cost of the heat exchanger by eliminating expansive machining operations typically utilized to form such pathways.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A method of forming a power electronics assembly, comprising:
    forming a plurality of pathway openings in a heat exchanger body;
    inserting a tubular member in each pathway opening of the plurality of pathway openings, the tubular member including a plurality of internal surface enhancements;
    defining an interference fit between the tubular members and the heat exchanger body via mechanical expansion of the tubular members to define a plurality of fluid pathways in the heat exchanger body; and
    installing one or more power electronics devices to the heat exchanger body;
    wherein the plurality of internal surface enhancements are formed simultaneously with the mechanical expansion of the tubular members in the heat exchanger body;
    wherein the mechanical expansion of the tubular members to define the interference fit and the forming of the plurality of internal surface enhancements is performed via insertion of an expansion bullet into an interior of each tubular member of the plurality of tubular members.

2. The method of claim 1, wherein the tubular members are formed from a flat sheet, which is rolled and mechanically secured into a tubular shape.

3. The method of claim 2, wherein the plurality of internal surface enhancements are formed on the flat sheet.

4. The method of claim 1, wherein the plurality of internal surface enhancements include a plurality of fins.

5. The method of claim 4, wherein the plurality of fins extend helically along a length of the fluid pathways.

6. The method of claim 1, wherein the plurality of fluid pathways are connected to an inlet manifold and an outlet manifold.

7. The method of claim 1, wherein one or more of the tubular members have a U-shaped bend.

8. A power electronics assembly, comprising:
    one or more power electronics devices; and
    a heat exchanger to which the one or more power electronics devices are mounted, the heat exchanger comprising:
        a heat exchanger body;

one or more pathway openings formed in the heat exchanger body;

a tubular member installed in each pathway opening of the one or more pathway openings, the tubular member including one or more internal surface enhancements;

wherein the tubular members are secured into an interference fit with the heat exchanger body via mechanical expansion of the tubular members to define a plurality of fluid pathways in the heat exchanger, wherein the one or more fluid pathways transfer thermal energy from the one or more power electronics devices into a flow of fluid in the one or more fluid pathways;

wherein the flow of fluid is a flow of liquid refrigerant diverted from a condenser of a heating, ventilation, and air conditioning (HVAC) system; and wherein the plurality of internal surface enhancements are formed simultaneously with the mechanical expansion of the tubular members in the heat exchanger body;

wherein the mechanical expansion of the tubular members to define the interference fit and the forming of the plurality of internal surface enhancements is performed via insertion of an expansion bullet into an interior of each tubular member of the plurality of tubular members.

9. The power electronics assembly of claim 8, wherein the plurality of internal surface enhancements include a plurality of fins.

10. The power electronics assembly of claim 9, wherein the plurality of fins extend helically along a length of the fluid pathways.

11. The power electronics assembly of claim 8, wherein the one or more tubular members includes a U-shaped bend.

12. The power electronics assembly of claim 8, further comprising:

an inlet manifold operably connected to the one or more fluid pathways at a first end of the one or more fluid pathways; and an outlet manifold operably connected to the one or more fluid pathways at a second end of the one or more fluid pathways, opposite the first end.

13. The power electronics assembly of claim 8, wherein the tubular members are formed from one of a copper or aluminum material.

14. The power electronics assembly of claim 8, wherein the plurality of fluid pathways each have an internal diameter in the range of 3 millimeters to 15 millimeters.

15. The power electronics assembly of claim 8, wherein each fin of a plurality of fins has a fin height in the range of 0.2 millimeters to 0.5 millimeters.

16. A power electronics assembly, comprising:

one or more power electronics devices; and a heat exchanger to which the one or more power electronics devices are mounted, the heat exchanger comprising:

a heat exchanger body;

one or more pathway openings formed in the heat exchanger body;

a tubular member installed in each pathway opening of the one or more pathway openings, the tubular member including one or more internal surface enhancements;

wherein the tubular members are secured into an interference fit with the heat exchanger body via mechanical expansion of the tubular members to define a plurality of fluid pathways in the heat exchanger, wherein the mechanical expansion of the tubular members to define the interference fit and the forming of the plurality of internal surface enhancements is performed via insertion of an expansion bullet into an interior of each tubular member of the plurality of tubular members.

17. The power electronics assembly of claim 16, wherein the one or more fluid pathways transfer thermal energy from the one or more power electronics devices into a flow of fluid in the one or more fluid pathways.

18. The power electronics assembly of claim 17, wherein the flow of fluid is a flow of liquid refrigerant diverted from a condenser of a heating, ventilation, and air conditioning (HVAC) system.

19. The power electronics assembly of claim 16 wherein the plurality of internal surface enhancements are formed simultaneously with the mechanical expansion of the tubular members in the heat exchanger body.

\* \* \* \* \*